(12) United States Patent
Kikuchi et al.

(10) Patent No.: US 7,479,779 B2
(45) Date of Patent: Jan. 20, 2009

(54) IMAGE SENSOR TEST SYSTEM

(75) Inventors: Hiroyuki Kikuchi, Tokyo (JP); Shuichi Shinhama, Tokyo (JP)

(73) Assignee: ADVANTEST Corporation, Tokyo (JP)

( * ) Notice: Subject to any disclaimer, the term of this patent is extended or adjusted under 35 U.S.C. 154(b) by 0 days.

(21) Appl. No.: 10/599,698

(22) PCT Filed: Jun. 8, 2004

(86) PCT No.: PCT/JP2004/007971

§ 371 (c)(1),
(2), (4) Date: Oct. 5, 2006

(87) PCT Pub. No.: WO2005/121739

PCT Pub. Date: Dec. 22, 2005

(65) Prior Publication Data

US 2007/0206967 A1    Sep. 6, 2007

(51) Int. Cl.
*G01R 31/28* (2006.01)
(52) U.S. Cl. ............... 324/158.1; 324/765; 324/753
(58) Field of Classification Search ............. 324/772, 324/158.1, 765, 753
See application file for complete search history.

(56) References Cited

U.S. PATENT DOCUMENTS

| | | | | |
|---|---|---|---|---|
| 4,510,673 A | * | 4/1985 | Shils et al. ............... 438/15 |
| 5,091,963 A | * | 2/1992 | Litt et al. ............... 382/149 |
| 5,374,888 A | * | 12/1994 | Karasawa ............... 324/765 |
| 5,631,573 A | * | 5/1997 | Ohno ............... 324/754 |
| 5,644,245 A | * | 7/1997 | Saitoh et al. ............... 324/754 |
| 5,650,732 A | * | 7/1997 | Sakai ............... 324/755 |
| 5,690,467 A | * | 11/1997 | Smith ............... 414/795.2 |
| 5,788,084 A | * | 8/1998 | Onishi et al. ............... 209/573 |
| 5,791,484 A | * | 8/1998 | Ikeda et al. ............... 206/717 |

(Continued)

FOREIGN PATENT DOCUMENTS

JP    3-211474    9/1991

(Continued)

OTHER PUBLICATIONS

English language Abstract of JP 11-282034.

(Continued)

*Primary Examiner*—Ha Tran T Nguyen
*Assistant Examiner*—Richard Isla Rodas
(74) *Attorney, Agent, or Firm*—Greenblum & Bernstein, P.L.C.

(57) ABSTRACT

An image sensor test system (10) bringing input/output terminals of an image sensor into contact with a contact (61) of a test head (60), emitting light to alight receiving surface of the image sensor from a light source (80) and, while doing so, inputting/outputting electrical signals between the contact (61) of the test head (60) and the image sensor so as to test the optical properties of the image sensor, provided with a loader use inverting device (32) for inverting an image sensor loaded into a supply tray stacker in a state with the light receiving surface facing upward, a contact arm (43) for gripping a back surface of an opposite side to the light receiving surface of the image sensor and moving the image sensor to bring the image sensor into contact with a contact (61) of the test head (60) in the state with the light receiving surface facing downward, and an unloader use inverting device inverting and unloaded the tested image sensor.

10 Claims, 9 Drawing Sheets

U.S. PATENT DOCUMENTS

| | | | |
|---|---|---|---|
| 5,952,841 A * | 9/1999 | Hiruta | 324/758 |
| 6,019,564 A * | 2/2000 | Kiyokawa et al. | 414/223.01 |
| 6,184,675 B1 * | 2/2001 | Bannai | 324/158.1 |
| 6,310,680 B1 * | 10/2001 | Taniguchi | 355/53 |
| 6,359,454 B1 * | 3/2002 | Khoury | 324/754 |
| 6,624,646 B2 * | 9/2003 | Zaiser | 324/754 |
| 6,788,091 B1 * | 9/2004 | Weber | 324/765 |
| 6,944,324 B2 * | 9/2005 | Tran et al. | 382/143 |
| 7,033,842 B2 * | 4/2006 | Haji et al. | 438/6 |
| 7,148,715 B2 * | 12/2006 | Akram et al. | 324/765 |
| 7,253,443 B2 * | 8/2007 | Yoshida et al. | 257/80 |
| 2001/0019275 A1 | 9/2001 | Pace et al. | |
| 2002/0011863 A1 * | 1/2002 | Takahashi et al. | 324/760 |
| 2003/0177633 A1 * | 9/2003 | Haji et al. | 29/743 |
| 2005/0007135 A1 * | 1/2005 | Schneidewind et al. | 324/757 |
| 2005/0151551 A1 * | 7/2005 | Okuda et al. | 324/758 |
| 2006/0119347 A1 * | 6/2006 | Shimada et al. | 324/158.1 |

FOREIGN PATENT DOCUMENTS

| | | |
|---|---|---|
| JP | 5-17025 | 1/1993 |
| JP | 6-241746 | 9/1994 |
| JP | 11-282034 | 10/1999 |
| JP | 2002-267571 | 9/2002 |
| JP | 2003-209862 | 7/2003 |
| JP | 2003-282642 | 10/2003 |
| KR | 96 0011213 | 8/1996 |

OTHER PUBLICATIONS

U.S. Appl. No. 10/599,374 to Kiyokawa et al., which was filed on Sep. 27, 2006.
English language Abstract of JP 2002-267571.
English language Abstract of JP 6-241746.
English language Abstract of JP 2003-282642.
English language Abstract of JP 5-17025.
English language Abstract of JP 2003-209862.
English language Abstract of KR 960011213.
English language Abstract of JP 3-211474.

* cited by examiner

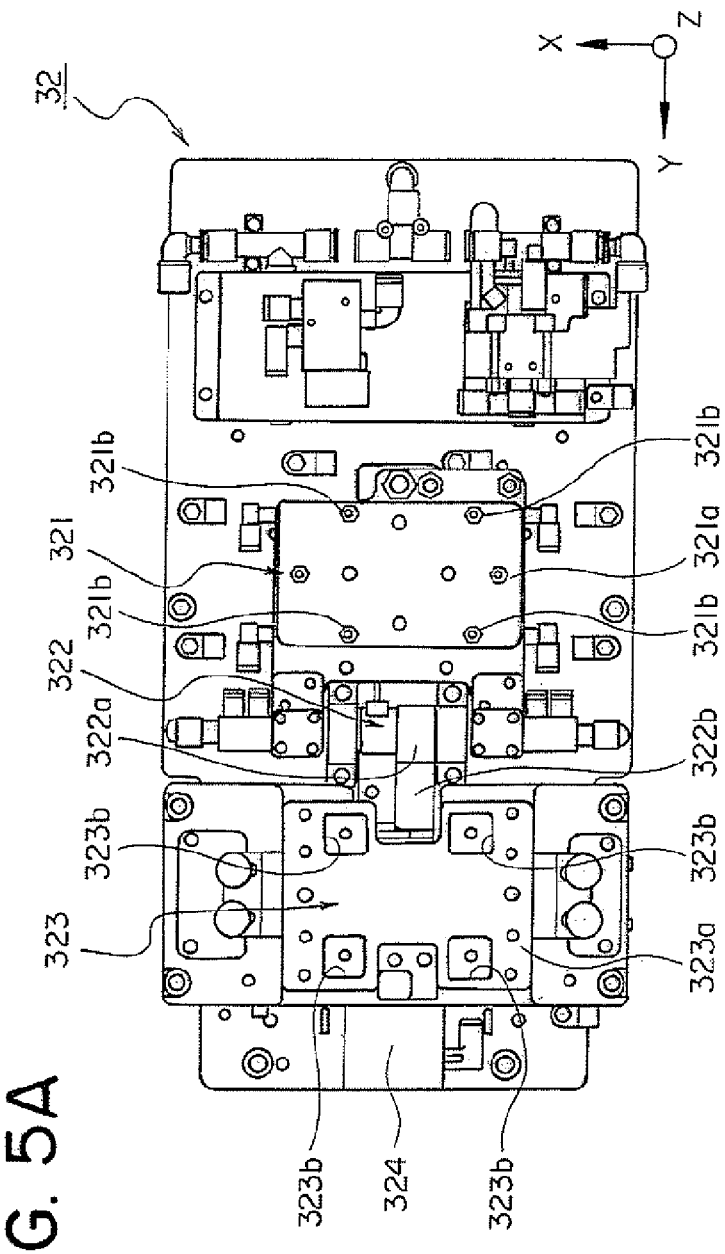
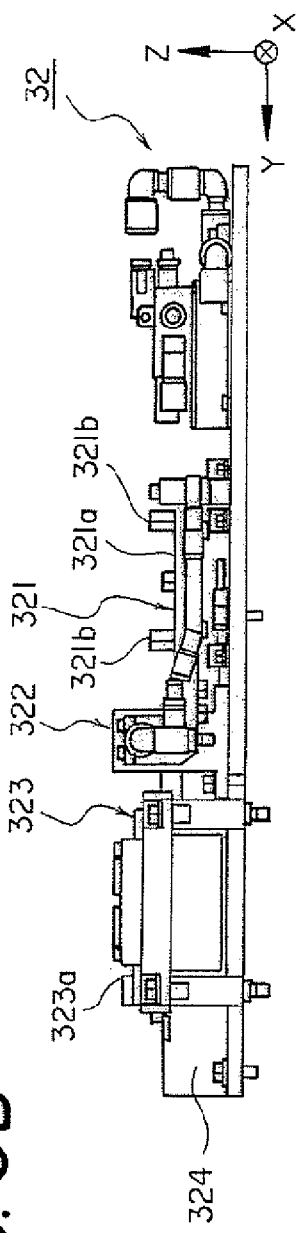
FIG. 5A
FIG. 5B

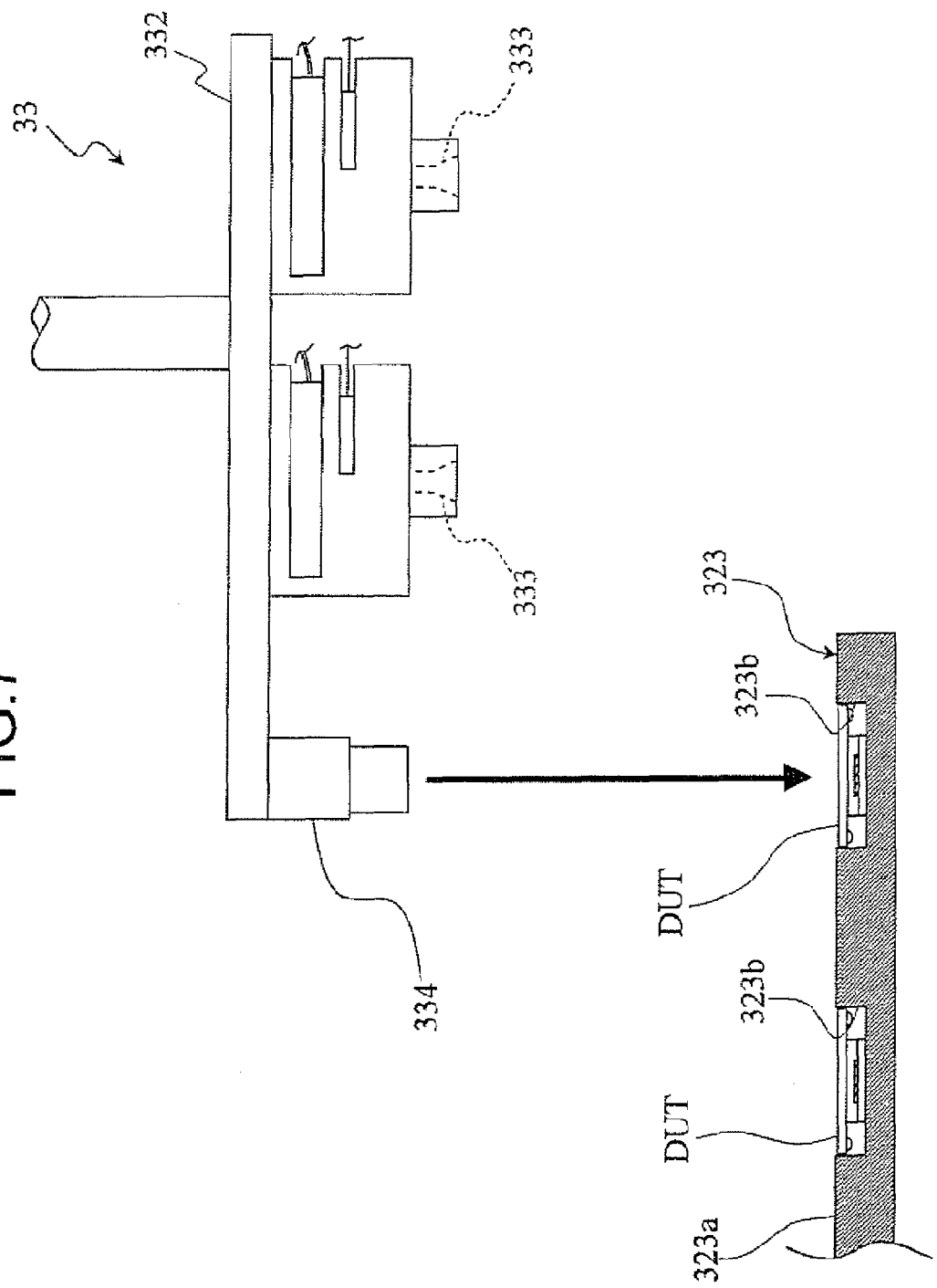

IMAGE SENSOR TEST SYSTEM

TECHNICAL FIELD

The present invention relates to an image sensor test system and electronic device test system provided with a function of inverting electronic devices under test for testing. In particular, the present invention relates to an image sensor test system for inverting CCD sensors or CMOS sensors or other image sensors, bringing the input/output terminals of the image sensors into electrical contact with contacts of a test head, emitting light to light receiving surface of the image sensors from a light source, and, while doing so, inputting and outputting electrical signals with that image sensors so as to test the optical properties of the image sensors.

TECHNICAL FIELD

In an electronic device test system called a "handler", large numbers of semiconductor integrated circuit devices and other electronic devices are placed on trays and loaded into the handler where the electronic devices under test are then individually brought into electrical contact with a test head and tested by the electronic device test system unit (hereinafter referred to as the "tester"). After the Lest ends, each electronic device is discharged from the test head and placed on a tray in accordance with the test results so as to sort the devices into categories such as good devices and defective devices and then unload them from the handler.

In testing, among these electronic devices, CCD sensors, CMOS sensors, and other image sensors, in the same way as explained above, each image sensor is brought into electrical contact with the test head and sorted in accordance with the test results. Further, in this test, by bringing the image sensors into electrical contact with the test head and while doing this emitting light to the light receiving surfaces or the image sensors from a light source, optical property tests such as a pupil inspection for inspecting if the amount of light received by each image sensor is constant or not are performed.

In a conventional image sensor test system for testing the optical properties of image sensors, due to the relation with the mounting step etc. after the test step, the image sensors are loaded and unloaded with their light-receiving surfaces facing upward, so they are moved in that state (that is, the state with the light receiving surfaces facing up) to the test head where the image sensors are then tested in the state with their light receiving surfaces facing upward.

Further, in the conventional image sensor test system, the handler itself was provided with the light source. Since, as explained above, the sensors were tested in the state with their light receiving surfaces facing upward, the light source was arranged positioned above the image sensors.

However, it testing image sensors in the state with their light receiving surfaces facing upward, the light receiving surfaces sometimes became covered with dust. This was liable to obstruct high accuracy tests.

Further, in recent image sensor test systems, there has been a demand for improving the test efficiency by increasing the number of simultaneous measurements. If as explained above, however, the handler itself mounts the light source positioned above the image sensors, an increase in the number of simultaneous measurements would lead to an increase in the number of the light sources and a larger size of the light sources, so handler and light source design would be restricted and securing a large number of simultaneous measurements would be difficult.

DISCLOSURE OF SHE INVENTION

The present invention has as its object to provide an image sensor test system enabling high accuracy tests of image sensors and enabling a large number of simultaneous measurements to be easily handled.

(1) To achieve the above-mentioned object, according to a first aspect of the present invention, there is provided an image sensor test system bringing input/output terminals of an image sensor into contact with a contact of a test head, emitting light to a light receiving surface of the image sensor from a light source and, while doing so, inputting/outputting electrical signals between she contact of the test head and the image sensor so as to test the optical properties of the image sensor, the image sensor test system provided with at least a pre-test sensor stacker for storing image sensors before testing, a loader use inverting means for inverting an image sensor supplied from the pre-test stacker, a contact arm for picking up and moving an inverted state image sensor inverted by the loader use inverting means and bringing input/output terminals of the inverted state image sensor into electrical contact with a contact of the test head, an unloader use inverting means for inverting an image sensor finished being tested, and a plurality of post-test sensor stackers for storing tested image sensors inverted by the unloader use inverting means (see claim 1).

According to the first aspect of the present invention, an image sensor test system for testing optical properties of an image sensor is provided with a loader use inverting means for inverting an image sensor before testing and an unloader use inverting means for inverting a tested image sensor.

Due to this, it becomes possible to invert an image sensor, loaded in a state with its light receiving surface facing upward, by an inverting means so that its light receiving surface faces downward, bring that inverted image sensor into contact with a contact of the test head by the contact arm so as to test it, then again invert that tested image sensor by the inverting means to make its light receiving surface face upward and unload it.

Therefore, an image sensor can be tested in the state with its light receiving surface facing downward, so the light receiving surface can be prevented from being covered by dust and high accuracy tests can be performed.

Further, since the image sensor can be tested in the state with its light receiving surface facing downward, it is possible to provide a light source under the image sensor separate from the handler, so the design freedom of the handler and light source is greatly improved and increases in the number of simultaneous measurements can be easily handled.

While not particularly limited to in the above invention, each of the loader use inverting means and the unloader use inverting means preferably can simultaneously invert two or more image sensors. Due to this, the throughput of conveyance of the image sensor test system is improved.

Specifically, each of the loader use inverting means and the unloader use inverting means nay be configured so as to have at least a first holder able to hold an image sensor and a rotation mechanism for making the first holder rotate.

While not particularly limited to in the above invention, the first holder preferably has a suction nozzle able to hold an image sensor by suction. Due to this, safe and accurate inversion operations can be performed.

Further, while not particularly limited to in the above invention, the first holder may be configured to be exchangeable with another first holder having a suction nozzle different from the suction nozzle of that first holder so as to match with the size or shape of the image sensor. Due to this, a single image sensor test system can handle a large number of types of image sensors.

While not particularly limited to in the above invention, the rotation mechanism can be configured to have a pinion gear supporting the first holder and a rack gear intermeshing with the pinion gear and to convert linear force supplied to the rack gear to rotational force so as to make the first holder rotate. Due to this, a rotation mechanism enabling stable rotary operation can be configured cheaply and simply.

While not particularly limited to in the above invention, each of the loader use inverting means and the unloader use inverting means may be configured to further have a second holder able to hold an image sensor after inversion and to have the second holder formed with a recess able to hold the image sensor. An inverted image sensor can be positioned relative to a contact of the test head by that recess.

Further, while not particularly limited to in the above invention, the second holder may be configured to be exchangeable with another second holder formed with a recess different from the recess formed in that second holder so as to match with the size or shape of the image sensor. Due to this, a single image sensor test system can handle a large number of types of image sensors.

While not particularly limited to in the above invention, the system may be further provided with an imaging means able to obtain an image of a back surface of the image sensor after being inverted by the loader use inverting means and before being supplied to the test head, may be further provided with a judging means for judging an emission pattern of light emitted from the light source and an input pattern of electrical signals input from contacts of the test head based on image information obtained by the imaging means, and may be further provided with selecting means for selecting a tested sensor stacker for unloading the image sensor to from among the plurality of tested sensor stackers based on device type information obtained by the imaging means and classification information of the test results.

(2) Further, to achieve the above-mentioned object, according so a second aspect of the present invention, there is provided a test method for an image sensor which brings input/output terminals of an image sensor into contact with a contact of a test head, emits light to a light receiving surface of she image sensor from a light source, and, while doing so, inputs and outputs electrical signals between the contact of the test head and the image sensor so as to test the optical properties of the image sensor, comprising at least a first inversion step of inverting an image sensor before testing, a test step of bringing the inverted state image sensor into electrical contact with a contact of the test head and emitting light to a light receiving surface of that image sensor from a light source to test the optical properties of that image sensor, and a second inversion step of inverting the tested inverted state image sensor.

According to the second aspect of the present invention, there is provided a test method of an image sensor which inverts an image sensor before testing by a first inversion step and inverts the tested image sensor by a second inversion step.

Due to this, it becomes possible to invert an image sensor loaded in a state with its light receiving surface facing upward before testing so that its light receiving surface faces downward and bring that inverted state image sensor into contact with a contact of a test head for testing, then again invert the tested image sensor to unload it with its light receiving surface facing upward.

Therefore, an image sensor can be tested in the state with its light receiving surface facing downward, so the light receiving surface can be prevented from being covered by dust and high accuracy tests can be performed.

Further, since an image sensor can be tested in the state with its light receiving surface facing downward, it is possible to provide a light source under the image sensor separate from the handler, so the design freedom of the handler and light source is greatly improved and increases in the number of simultaneous measurements can be easily handled.

While not particularly limited to in the above invention, it is preferable to hold and simultaneously invert two or more image sensors in the first inversion step and the second inversion step. Due to this, the throughput of conveyance or the image sensor test system is improved.

While not particularly limited to in the above invent on, the method may be configured to further comprise, before the test step, an imaging step of obtaining an image of an image sensor to obtain device type information, may be configured to further comprise a judgment step of judging an emission pattern of light emitted from the light source and an input pattern of electrical signals input from a contact of the test head based on the device type information obtained at the imaging step and, in the test step, to emit light to the light receiving surface of the image sensor in accordance with the emission pattern and input and output electrical signals between a contact of the test head and the image sensor in accordance with the input pattern, and may be configured to sort tested image sensors based on the device type information obtained at the imaging step and classification information of the test results.

(3) Further, to achieve the above-mentioned object, according to a third aspect of the present invention, there is provided an electronic device test system bringing input/output terminals of an electronic device under test into electrical contact with a contact of a test head and inputting/outputting electrical signals between the contact of the test head and the electronic device so as to test the electronic device, the electronic device test system provided with at least a pre-test electronic device stacker for storing electronic devices before testing, a loader use inverting means for inverting an electronic device supplied from the pre-test electronic device stacker, a contact arm for picking up and moving an inverted state electronic device inverted by the loader use inverting means and bringing input/output terminals of the inverted state electronic device into electrical contact with a contact of the test head, an unloader use inverting means for inverting an electronic device finished being tested to its original state, and a plurality of post-test electronic device stackers for storing tested electronic devices inverted by the unloader use inverting means.

BRIEF DESCRIPTION OF THE DRAWINGS

FIG. 5A is a plan view of the loader use inverting device shown in FIG. 4.

FIG. 5B is aside view of the loader use inverting device shown in FIG. 4.

FIG. 7 is a view of the state of identification of the type or image sensor in an image sensor test system according to an embodiment of the present invention.

BEST MODE FOR WORKING THE INVENTION

Below, embodiments of the present invention will be explained based on the drawings.

Figure 1A:
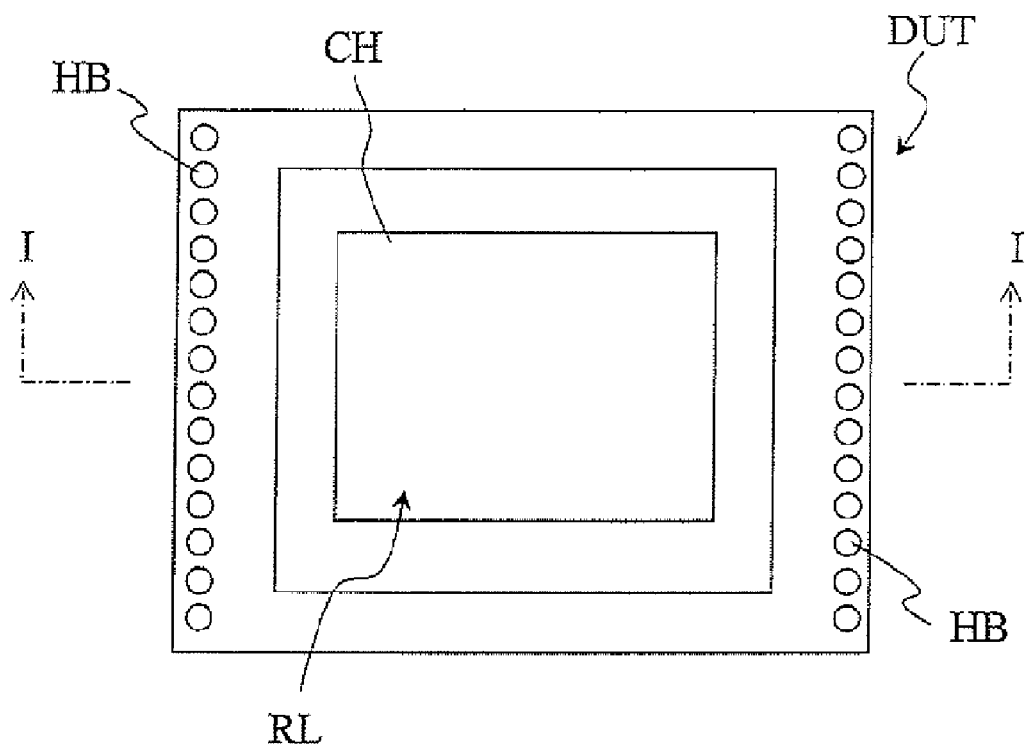
FIG. 1A is a plan view of an image sensor to be tested by an image sensor test system of a first embodiment of the present invention.
Figure 1B:
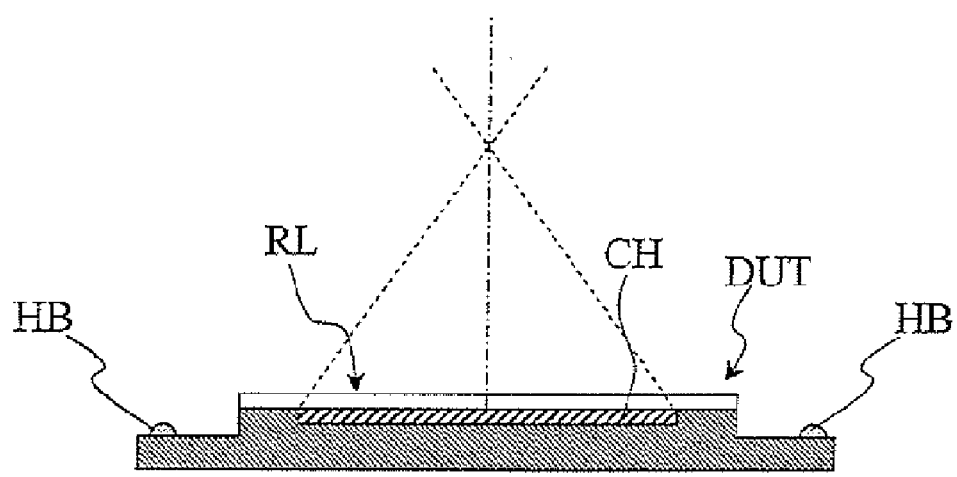
FIG. 1B is a sectional view of the image sensor along the line I-I of FIG. 1A.

FIG. 1A is a plan view of an image sensor to be tested by an image sensor test system according to a first embodiment of the present invention, while FIG. 1B is a sectional view or an image sensor along the line I-I of FIG. 1A.

First, explaining an image sensor to be tested by an image sensor test system according to an embodiment of the present invention, this image sensor DUT, as shown in FIG. 1A, has a chip CH with microlenses arranged at its approximate center and has input/output terminals HB led out at the periphery. These chip CH and terminals HB are packaged to form a CCD sensor, CADS sensor, etc. As shown in FIG. 1B, it is a type of image sensor with input/output terminals HB led out from the same plane as the light receiving surface RL of the chip CH where the microlenses are formed.

Figure 2:
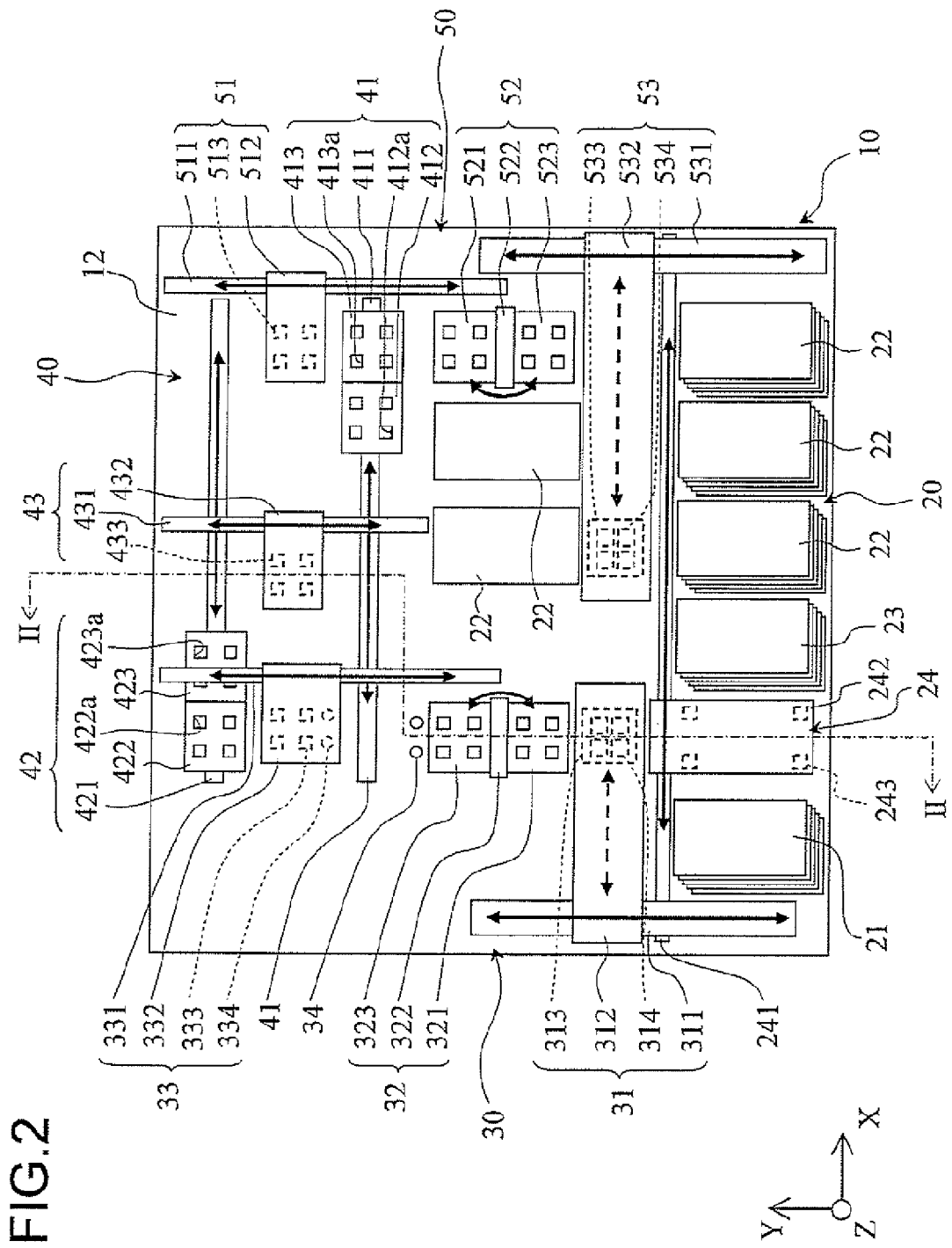
FIG. 2 is a schematic plan view of an image sensor test system according to an embodiment of the present invention.
Figure 3:
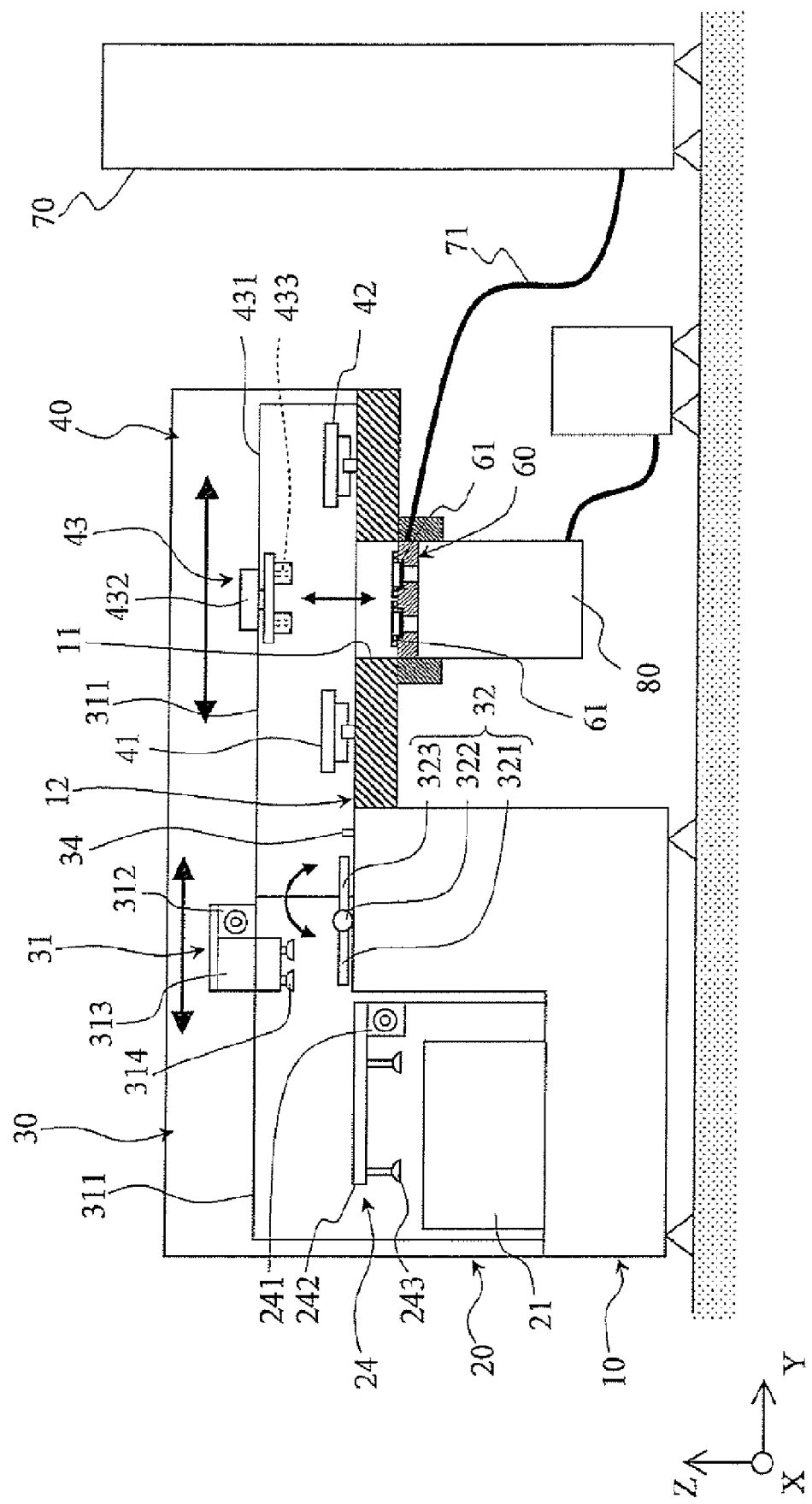
FIG. 3 is a sectional view of the image sensor test system along the line II-II of FIG. 2.

FIG. 2 is a schematic plan view of an Image sensor test system according to an embodiment of the present invention, while FIG. 3 is a sectional view of the image sensor test system along the line II-II of FIG. 2.

The image sensor test system 10 of this embodiment of the present invention is a system for testing a type of image sensor DUT shown in the above-mentioned FIG. 1A and FIG. 1B. As shown in FIG. 2 and FIG. 3, it is provided with a sensor stacker 20, a loader 30, a tester 40, and an unloader 50 and can use the test head 60 and tester 70 (see FIG. 3) and light source 80 (see FIG. 3) to simultaneously test four image sensors DUT.

This image sensor test system 10 supplies sensors from the sensor stacker 20 through the loader 30 to the tester 40, pushes them against the contacts 61 of the test head 60 at the tester 40, emits light from the light source 80 to the light receiving surfaces RL of the image sensors DUT and, while doing so, inputs and outputs electrical signals between the tester 70 and the image sensors DUT through the contacts 61 and input/output terminals HB for testing, then classifies the tested image sensors DUT through the unloader 50 in accordance with the classification information based on the test results and stores them in the sensor stacker 20.

Below, the different parts of this image sensor test system 10 will be explained.

Sensor Stacker 20

The sensor stacker 20, as shown in FIG. 2 and FIG. 3, is comprised of a supply tray stacker 21 (pre-test image sensor stacker), classification tray stackers 22 (rested image sensor stacker), an empty tray stacker 23, and a tray conveyor 24 and can store pre-test and tested image sensors DUT.

The supply tray stacker 21 holds stacked together a plurality of supply trays on which a plurality of, for example about 20, image sensors DUT before testing are carried. In the present embodiment, the image sensors DUT before testing are unloaded through this supply tray stacker 21 to the inside of the image sensor test system 10 in the state with their light receiving surfaces RL facing upward.

The classification tray stackers 22 hold stacked together a plurality of classification trays on which the plurality of tested image sensors DUT can be carried. In the example shown in FIG. 2, three classification tray stackers 22 are provided. Note that in general five or more classification tray stackers 22 are provided.

By providing three classification tray stackers 22, for example, the image sensors DUT can be sorted and stored in a maximum of three classes in accordance with the test results such as good/defective devices and, among defective devices, ones for which retesting is required/not required.

In the present embodiment, the tested image sensors DUT are unloaded through these classification tray stackers 22 to outside the image sensor test system 10 in the state with their light receiving surfaces RL facing upward.

The empty tray stacker 23 stores the empty trays from which all pre-test image sensors DUT carried on the supply trays have beer supplied to she tester 30.

The tray conveyor 24 is a means able to move trays in the XZ-axial direction in FIG. 2. It holds a tray emptied of image sensors DUT at the supply tray stacker 21 by suction pads 243, causes an Z-axial direction actuator (not shown) to rise, makes a movable head 242 slide along the X-axial direction rail 241 fixed on the table 12 of the image sensor test system 10, and conveys the empty tray to the empty tray stacker 23. On the other hand, when the classification trays are filled with tested image sensors DUT in a classification tray stacker 22, the tray conveyor 24 conveys empty trays from the empty tray stacker 23 and refills the classification tray stacker 22.

Note that the numbers of stackers in the present invention are not particularly limited to the numbers explained above and may be suitably set in accordance with need.

Loader 30

The loader 30, as shown in FIG. 2 and FIG. 3, is comprised of a loader use XYZ movement device 31, a loader use inverting device 32 (loader use inverting means), and a loader use YZ movement device 33 and is designed to be able to supply image sensors DUT from the supply tray stacker 21 of the sensor stacker 20 to the tester 40.

The loader use XYZ movement device 31 is comprised of a Y-axial direction rail 311 fixed to a table 12 of the image sensor test system 10, an X-axial direction rail 312 supported to be able to slide in the Y-axial direction along this Y-axial direction rail 311, a movable head 313 supported to be able to slide in the X-axial direction along this X-axial direction rail 312, and four suction pads 314 supported through an Z-axial direction actuator (not shown) at its bottom end. This loader side XYZ movement device 31 can move the image sensors DUT carried on a supply tray of the supply tray stacker 21 of the sensor stacker 20 to the loader use inverting device 32. It is designed to be able to simultaneously move four image sensors DUT.

Figure 4:
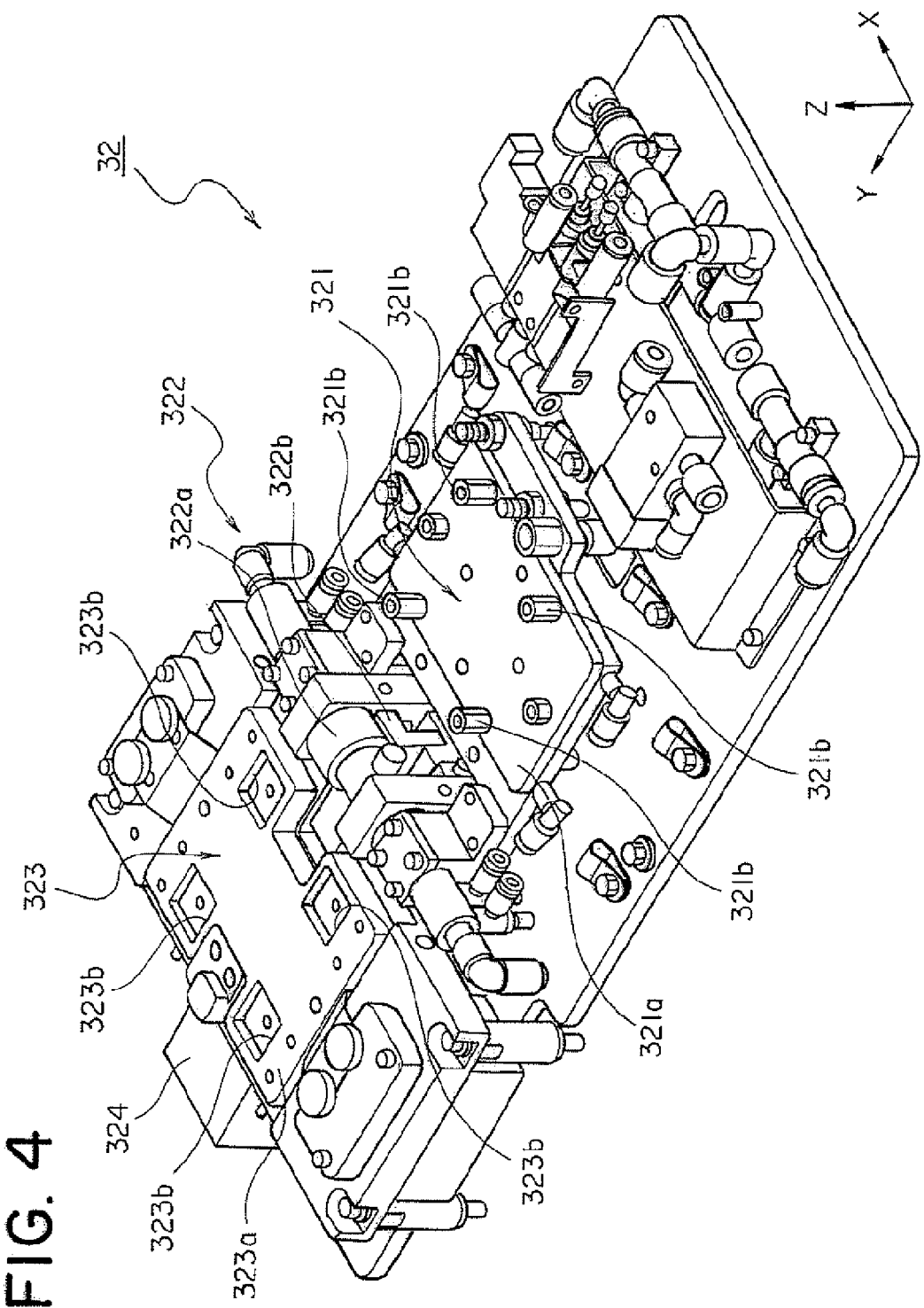
FIG. 4 is a perspective view of a loader use inverting device of an image sensor test system according to an embodiment of the present invention.
Figure 6A:
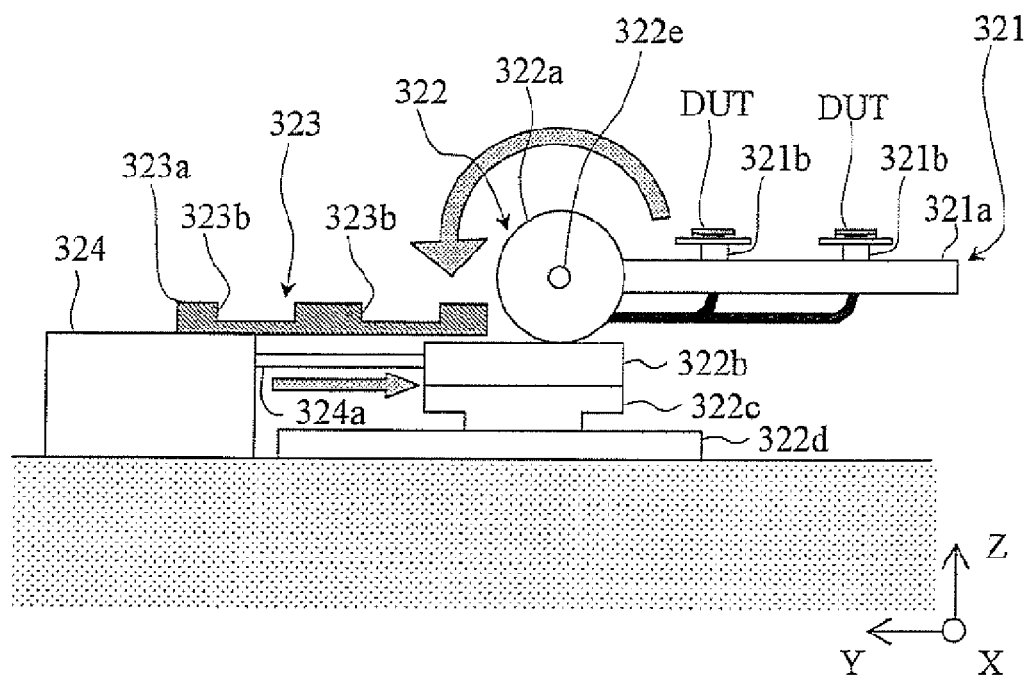
FIG. 6A is a side schematic view for explaining the operation of the loader use inverting device shown in FIG. 4 and shows the state before inversion.
Figure 6B:
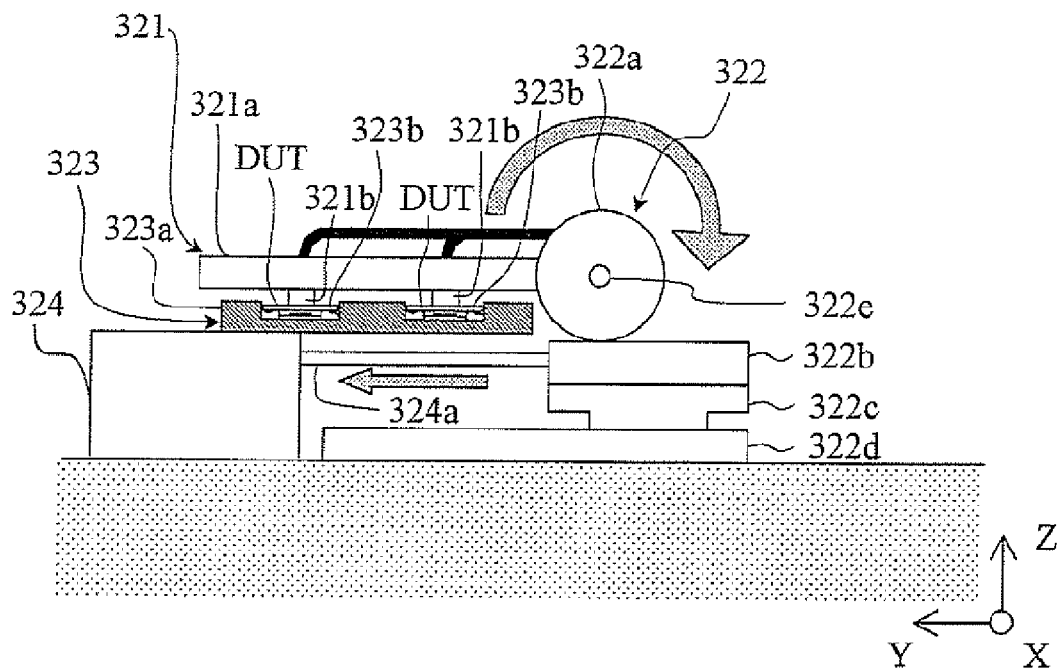
FIG. 6B is a side schematic view for explaining the operation of the loader use inverting device shown in FIG. 4 and shows the state after inversion.

FIG. 4 is a perspective view of a loader use inverting device of an image sensor test system according to an embodiment of the present invention, FIG. 5A is a plan view of the loader use inverting device shown in FIG. 4, FIG. 5B is a side view of the loader use inverting device shown in FIG. 4, and FIGS. 6A and B are side schematic views for explaining the operation of the loader use inverting device shown in FIG. 4, where FIG. 6A shows the state before inversion and FIG. 6B shows the state after inversion.

The loader use inverting device 32, as shown in FIG. 4 to FIG. 6B, is comprised of a first holder 321 for holding image sensors DUT transported by the loader use XYZ movement device 31, a rotation mechanism 322 for making this first holder 321 rotate, a second holder 323 for holding image sensors DUT held by the first holder 321 rotated by this rotation mechanism 322, and an air cylinder 324 for supplying the drive force for inverting the image sensors DUT.

The first holder 321 is comprised of a flat plate member 321a on which four suction nozzles 321b are attached and can hold image sensors DUT loaded in the state with their light receiving surfaces RL facing upward by suction at their back surfaces. These four suction nozzles 321b are arranged to correspond to the arrangement of the four contacts 61 of the test head 60.

Further, the suction nozzles 321b of the first holder 321 are attached detachably at the plate member 321a by screws or other means. When for example a change of the lot of the image sensors etc. results in a change of the tested sensors to image sensors different in outer shape or form, the suction nozzles 321b can be exchanged with other suction nozzles having shapes or forms different from them so as to match with the changed image sensors.

The rotation mechanism 322 is comprised of a pinion gear 322a supporting the first holder 321 and able to rotate about a shaft 322e, a rack gear 322b intermeshing with this pinion gear 322a and fixed to a piston rod 324a (see FIGS. 6A and B) of the air cylinder 324, a guide body 322c (see FIGS. 6A and B) to which this rack gear 322b is fixed by bolts etc., and a guide rail 322d on which this guide body 322c can slide in the Y-axial direction (see FIGS. 6A and B) and is designed to convert linear force supplied from the air cylinder 324 through the piston rod 324a to rotational force through the rack and pinion 322a and 322b and make the first holder 321 rotate.

The second holder 323 is comprised of a flat plate member 323a on which four recesses 323b are formed. The recesses 323b have sizes enabling image sensors DUT to be held. Further, the recesses 323b are formed to correspond to the arrangement of the four contacts 61 of the test head 60 in the same way as the above-mentioned four suction nozzles 321b. By having the recesses 323b hold image sensors DUT, they are positioned relative to the contacts 61 of the test head 60. Note that the edges of the recesses 323b may be tapered so as to facilitate holding of the image sensors DUT in the recesses 323b.

Further, the second holder 323 is attached detachably to the body of the loader side inverting device 32 by bolts or other means. When for example a change in the lot of the image sensors etc. results in a change of the tested sensors to image sensors different in shape, the second holder 323 can be exchanged with another second holder formed with recesses of different sizes from the recesses 323b so as to match with the changed image sensors.

In the loader use inverting device 32 configured as explained above, as shown in FIG. 6A, the image sensors DUT moved by the loader use XYZ movement device 31 are held by suction by the suction nozzles 321a of the first holder 321 and, as shown in FIG. 6B, the air cylinder 324 is driven to make the rotation mechanism 322 rotate the first holder 321. When that first holder 321 rotates 180°, the suction is released and the image sensors DUT are dropped into the recesses 323b of the second holder 323. Due to this, the image sensors DUTZ loaded in the state with their light receiving surfaces RL facing upward can be supplied to the tester 40 inverted so that their light receiving surfaces RL face downward.

Note that in the present embodiment, use of a rack and pinion mechanism to invert the image sensors DUT was explained, but the present invention is not particularly limited in means so long as the image sensors DUT can be rotated. For example, a link device etc. may be used to convert linear force from a cylinder etc. to rotational force, a gear mechanism, belt mechanism, chain mechanism, etc. may be used to convey rotational force supplied from a motor etc., or a rotary actuator etc. may be used to directly supply rotational force so as to invert the image sensors DUT. As the drive source for the linear force or rotational force supplied to these, air, electricity, oil pressure, etc. may be mentioned.

Further, in the present embodiment, suction was illustrated as one means for the first holder 321 holding the image sensors DUT, but the present invention is not particularly limited to this. For example, it is also possible to use a mechanical chuck for gripping the top and bottom end faces of the image sensors. Further, in this case, it is also possible not to provide the loader side inverting device 32 with a second holder 323, but have the loader use YZ movement device 33 directly receive the image sensors DUT from the first holder 321 holding the inverted image sensors DUT.

Further, the present embodiment was configured to rotate the first holder 321 holding the image sensors DUT by suction by the suction nozzles 321b, but the present invention is not particularly limited to this. For example, instead of providing suction nozzles, both of the first holder 321 and second holder 323 may be configured to rotate and the first holder 321 and the second holder 323 may be rotated while holding the image sensors DUT so as to invert the image sensors DUT.

The loader use YZ movement device 33 is comprised of a Y-axial direction rail 331 fixed to the table 12 of the image sensor test system 10, a movable head 332 supported to be able to slide in the Y-axial direction along the Y-axial direction rail 331, and four suction pads 333 supported through a Z-axial direction actuator (not shown) at its bottom end.

This loader use YZ movement device 33 is designed to be able to move the image sensors DUT held at the second holder 323 of the loader use inverting device 32 to any of the buffers 41 and is designed to be able to simultaneously move four image sensors DUT.

Further, as shown in FIG. 2 and FIG. 3, the loader use inverting device 32 and the first buffer 31 of the tester 40 are provided between them with a spraying nozzle 34 able to spray nitrogen gas upward in the vertical direction.

When moving the image sensors DUT inverted by the loader use inverting device 32 by the loader use YZ movement device 33 to the tester 40, the image sensors DUT passing above this spraying nozzle 34 may be sprayed with nitrogen gas sprayed by the sprayed nozzle 34 so as to clean the light receiving surfaces RL of the image sensors DUT. Note that the gas sprayed from spraying nozzle 34 is not limited to nitrogen gas. For example, it may also be compressed air supplied through a clean filter etc.

Figure 8:
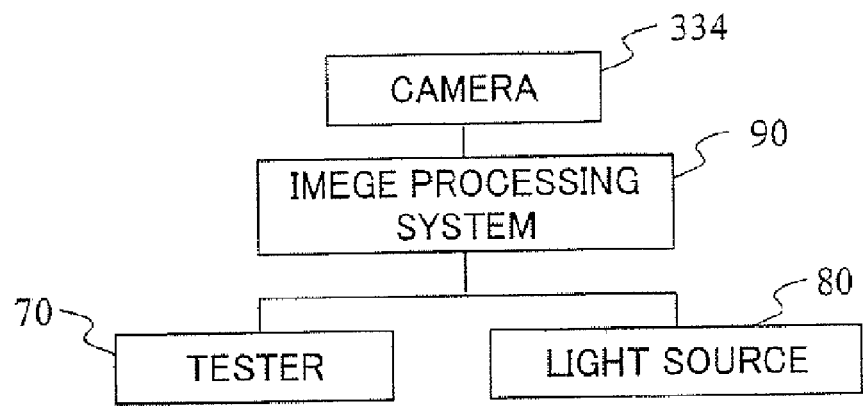
FIG. 8 is a block diagram showing the system configuration for identifying the test of an image sensor in an image sensor test system according to an embodiment of the present invention.

FIG. 7 is a view of the state of identification of the type of image sensor in an image sensor test system according to an embodiment of the present invention, while FIG. 8 is a block diagram showing the system configuration for identifying the device type of an image sensor in an image sensor test system according to an embodiment of the present invention.

The loader use YZ movement device 33, as shown in FIG. 7, is provided with a CCD camera or other camera 334 (imaging means) attached in a state with its optical axis facing vertically downward. This camera 334 can obtain an image of an image sensor DUT held in a recess 323a of the second holder 323 of the loader use inverting device 32. In particular, it is possible to obtain an image of the back surface of the image sensor DUT opposite to the light receiving surface RL. This camera 334, as shown in FIG. 8, is connected so that it can transmit the obtained image information to an image processing system 90.

The image processing system 90, for example, has an image processing processor etc. By processing the image information obtained by the camera 334, it can read for example bar codes and other product information marked on the back surface of the image sensor DUT by ink marking, laser marking, or another means or past processing information and other device type information given in previous processes. This image processing system 90, as shown in FIG. 8, is connected so as to be able to transmit the results of Identification of the image sensor DUT, that is, the device type information, to the tester 70 and light source 80. Due to this, it becomes possible to run tests under test conditions suitable so the device type information.

The tester 70 inputs electrical signals from the contacts 61 of the test head 60 to the input/output terminals HB of the image sensors DUT and uses the results of identification of the image processing system 90 to judge the input pastern of the electrical signals corresponding to the device type of the image sensors DUT. Further, the light source 80 emits light to the light receiving surfaces RL of the image sensors DUT at the time of tests and uses the results of identification of the image processing system 90 to judge the emission pattern corresponding to the device type of the image sensors DUT. The tester 70, light source 80, and image processing means 90 in the present embodiment correspond to an example of the judging means in the present invention.

Further, the image processing system 90 is connected to be able to transmit the above-mentioned results of identification to a controller (not shown) of the image sensor test system 10. When sorting and storing the tested image sensors DUT in the plurality of classification tray stackers 22 as explained above, it can use the classification information and device type information of the test results to sort the image sensors DUT. Specifically, for example, when testing two types of image sensors DUT, that is, the Device Type A and Device Type B, it can sort and store good sensors of the Device Type A, defective sensors of the Device Type A, good sensors of the Device Type B, and defective sensors of the Device Type B in the classification tray stackers 22. Due to this, it becomes possible to suitably handle tests of short runs of diverse image sensors DUT. The controller (not shown) and image processing system 90 of the image sensor test system 100 correspond to an example of the selecting means of the present invention.

Note that while not particularly shown, this loader 30 may, for example, be provided with a heat plate between the supply tray stacker 21 and the loader use inverting device 32 and apply the desired thermal stress so the image sensors before testing in accordance with need.

Tester 40

Figure 9:
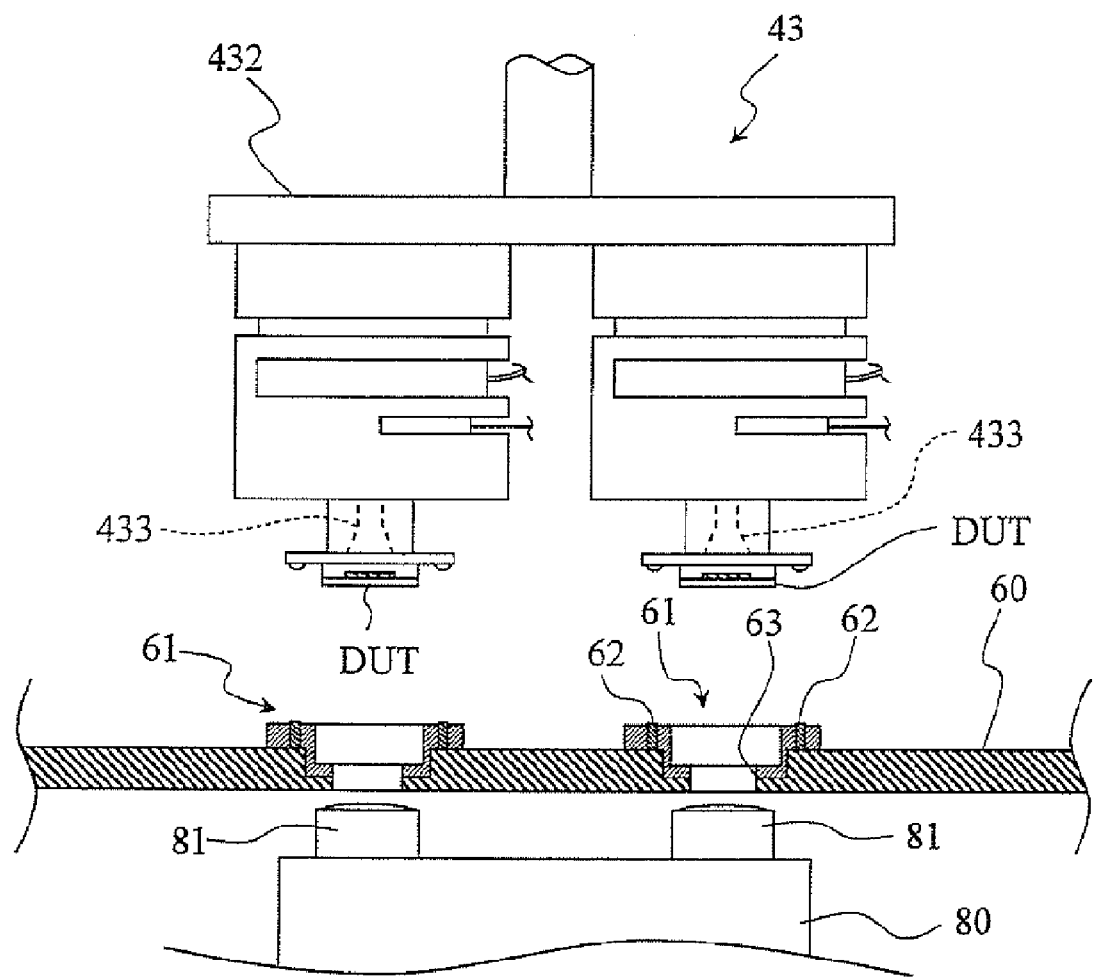
FIG. 9 is a schematic sectional view of a tester of an image sensor test system according to an embodiment of the present invention.

FIG. 9 is a schematic cross-sectional view of a Lester of an image sensor test system according to an embodiment of the present invention.

The tester 40 is comprised of two buffers 41 and 42 and a contact arm 413 and is designed to be able to use the Lest head 60 and light source 80 to test the optical properties of the image sensors DUT. It can bring the input/output terminals HR of the image sensors DUT into contact with the contacts 61 of the test head 60, emit light to the light receiving surfaces of the image sensors DUT from the light source 80, and, while doing so, input and output signals between the contacts 61 and image sensors DUT so as to test whether or not the amounts of light received by the image sensors DUT are constant and other optical properties of the image sensors DUT. The contacts 61 are provided with openings 63 at their centers to enable light to be emitted to the light receiving surfaces RL of the image sensors DUT.

First, explaining the test head 60 used in the tester 40, as shown in FIG. 9, this test head 60 is configured by a board on which four contacts 61 are arranged in two rows and two columns. These are arranged so as to substantially match with the arrangement of the holders of the later explained contact arm 43. Note that in FIG. 9, of the four contacts 61, the rear, side two contacts 61 are concealed by the front side two contacts 61, so only two contacts 61 are shown.

The contacts 61 are provided with pluralities of contact pins 62. These contact pins 62 are arranged to substantially match the arrangement of the input/output terminals HB of the image sensors DUT of the device type to be tested.

This test head 60, as shown in FIG. 3, is detachably attached to the image sensor test system 10 so as to fill the opening 11 formed in the table 12 of the image sensor test system 10. The contacts 61, as shown in the figure, are electrically connected through a cable 71 to the tester 70.

Further, in the image sensor test system 10 according to the present embodiment, as shown in FIG. 9, it is made possible to emit light from below to the light receiving surfaces RL of the image sensors DUT by forming openings 63 at the substantial centers of the contacts 61 of the test head 60. The openings 63 have sizes of extents enabling visual recognition of the light receiving surfaces RL of the image sensors DUT from below.

When a change in the device type of the image sensors DUT results in a change in the shapes of the image sensors DUT or the arrangement of input/output terminals HB, this test head 60 can be exchanged with another test head suitable for the changed image sensors DUT so as to enable a single image sensor test system 10 to handle tests for different types of image sensors DUT.

The tester 40 of the image sensor test system 10 according to the present embodiment, as shown in FIG. 3 and FIG. 9, is provided with a light source 80 having four emission parts 81 able to emit light vertically downward and is designed to enable the emission parts 81 to simultaneously emit light through the openings 63 formed in the contacts 61 to the light receiving surfaces RL of the four image sensors DUT to be simultaneously tested.

The first buffer 41 of the tester 40 is comprised of an X-axial direction rail 411 fixed to the table 12 of the image sensor test system 10, a pre-test buffer 412 able to slide in the X-axial direction along the X-axial direction rail 411, and a post-test buffer 413 able to glide integrally with this pre-test buffer 412 in the X-axial direction along the X-axial direction rail 411.

This first buffer 41 is designed to be able to receive image sensors DUT transported by the loader use YZ movement device 33 to the tester 40 at the pro-test buffer 412, slide them along the X-axial direction rail 411, and supply them to the contact arm 43. Further, it is designed to be able, after the test, to receive the image sensors DUT discharged by the contact arm 43 at the post-test buffer 413, slide them along the X-axial direction rail 411, and move them to the operating region of the later explained unloader use YZ movement device 51.

The surfaces of both of the pre-test buffer 412 and post-test buffer 413 are formed with recesses 412a, 413a having sizes able to hold the image sensors DUT. Mote that the edges of these recesses 412a, 413a may be tapered to facilitate holding of the image sensors DUT in the recesses 412a, 413a.

The second buffer 42 is also comprised, like the first buffer 41, of an X-axial direction rail 421, a pre-test buffer 422, and a post-test buffer 423 and is designed to receive pre-test image sensors DUT from the loader use YZ movement device 33 at the pre-test buffer 422 and supply them to the contact arm 43 and to receive tested image sensors DUT from the contact arm 43 and move them to the operating region of the unloader use YZ movement device 51.

In the image sensor test system 10 according to the present embodiment, by providing the two buffers 41, 42, while either of the first or second buffer 41, 42 is supplying the contact arm 43 with image sensors DUT for testing, the other second or first buffer 42, 41 car receive pre-test image sensors DUT from the loader use YZ movement device 33 or discharge tested image sensors DUT to the unloader use YZ movement device 51, so the test efficiency of the image sensor test system 10 can be raised. Note that the number of the buffers 42, 42 is non limited to two and may be suitably set in accordance with the testing time of the image sensors DUT etc.

The contact arm 43, as shown in FIG. 2 and FIG. 3, is comprised of a Y-axial direction rail 431 fixed to the table 12 of the image sensor test system 10, a movable head 432 able to slide in the Y-axial direction along this Y-axial direction rail 431 and having a Z-axial direction actuator (not shown) able to slide in the Z-axial direction, and four suction pads 433 able to hold the image sensors DUT by suction. The four suction pads 433 are attached to the bottom surface of the movable head 432 so as to substantially match with the arrangement of the four contacts 61 provided at the test head 60.

This contact arm 43 is designed to be able to simultaneously hold four image sensors DUT. It is designed to be able to simultaneously press the tour image sensors DUT supplied from the buffers 41, 42 against the contacts 61 of the test head 60, then simultaneously discharge the tested four image sensors DUT to the buffers 41, 42. Note that while not particularly shown, the movable head 432 may be provided with a built-in heater and temperature sensor to maintain the thermal stress applied by the above-mentioned heat plaza.

Unloader 50

The unloader 50, as shown in FIG. 2 and FIG. 3, is comprised of an unloader use YZ movement device 51, an unloader use inverting device 52 (unloader use inverting means), and an unloader use XYZ movement device 53 and is designed to be able to unload tested image sensors DUT discharged from the tester 40 from the buffers 41, 42 to the sensor stacker 20.

The unloader use YZ movement device 51, in the same way as the loader use YZ movement device 33, is comprised of a Y-axial direction rail 511 fixed to the table 12 of the image sensor test system 10, a movable head 512 supported movably in the Y-axial direction along the Y-axial direction rail 511, and four suction pads 513 supported through a Z-axial direction actuator (not shown) at its bottom end.

This unloader use YZ movement device 51 is designed to be able to move image sensors DUT discharged from the Lester 40 from the first and second buffers 41, 42 to the unloader use inverting device 52. It is designed to be able to simultaneously move four image sensors DUT.

The unloader use inverting device 52, in the same way as the above-mentioned loader use inverting device 32, is comprised of a first holder 521 comprised of a plate member provided with four suction nozzles, a rotation mechanism 522 for converting linear force supplied from an air cylinder to rotational force by a rack and pinion mechanism and making the first holder 521 rotate, and a second holder 523 comprised of a plate member formed with four recesses.

This unloader use inverting device 52 holds the image sensors DUT transported by the unloader use YZ movement device 51 at the first holder 521 by suction, makes the first holder 521 rotate 180° by the rotation mechanism 522, then releases the suction and drops the image sensors DUT into the recesses of the second holder 523. Due to this, it becomes possible to unload image sensors DUT tested in the state with their light receiving surfaces RL facing downward to the sensor stacker 20 inverted so that their light receiving surfaces RL face upward.

The unloader use XYZ movement device 53 is comprised of a Y-axial direction rail 531 fixed to the table 12 of the image sensor test system 10, an X-axial direction rail 532 supported to be able to slide in the Y-axial direction along the Y-axial direction rail 531, a movable head 533 supported to be able to slide in the X-axial direction along the X-axial direction rail 532, and four suction pads 534 supported through a Z-axial direction actuator (not shown) at its bottom end. This unloader use XYZ movement device 53 is designed to move and sort the image sensors DUT inverted by the unloader use inverting device 52 on to the classification trays of the classification tray stackers 22 of the sensor stacker 20 in accordance with the test results.

Below, a test of the image sensors DUT by the image sensor test system 10 according to the present embodiment will be explained.

First, the loader use XYZ movement device 31 uses the four suction pads 314 to pick up four image sensors DUT carried on a supply tray of the supply tray stacker 21 of the sensor stacker 20. Note that the image sensors DUT are carried on the supply tray in the state with their light receiving surfaces RL facing upward.

Next, the loader use XYZ movement device 31 moves the four image sensors DUT to position them at the suction nozzles 321b of the first holder 321 of the loader use inverting device 32, then releases the suction of the suction pads 314. Simultaneously with this, the suction nozzles 321b of the loader use inverting device 32 start suction and, as shown in FIG. 6A, hold the four image sensors DUT by the first holder 31 of the loader use inverting device 32.

Next, the movement device drives the air cylinder 324 of the loader use inverting device 32 in a direction causing the piston rod 324a to extend, whereby, as shown in FIG. 6B, the rack gear 322b and guide body 322c slide along the guide rail 322d in the Y-axial negative direction, the pinion gear 322a intermeshed with that rack gear 322b rotates, and the first holder 321 holding the image sensors DUT rotates 180° (first inversion step).

When the rotation of the pinion gear 322a leads to the first holder 321 rotating 180°, the four image sensors DUT held by the suction nozzles 321b of the first holder 321 are placed in the recesses 323b formed in the second holder 323. When the recesses 323b of the second holder 323 hold the image sensors DUT, the suction of the first holder 321 on the image sensors DUT is released.

The image sensors DUT inverted by the loader use inverting device 32 in this way so that their light receiving surfaces RL face upward are supplied through the loader use YZ movement device 33 and the first or second buffers 41, 42 to the contact arm 43.

Note that the loader use YZ movement device 33, before picking up the image sensors DUT inverted by the loader use inverting device 32, uses the camera 334 to obtain an image of a back surface of an image sensor DUT (imaging step). That image information is processed by the image processing system 90 to identify the device type of the image sensor DUT.

Further, at the time of movement by the loader use YZ movement device 33, the spraying nozzle 34 sprays nitrogen gas toward the image sensors DUT to clean the light receiving surfaces RL of the image sensors DUT On the other hand, after transferring the inverted image sensors DUT to the loader use YZ movement device 33, the loader use inverting device 32 drives the air cylinder 324 in a direction causing the piston rod 324a to retract, rotates the rotation mechanism 322 −180°, and thereby prepares for the inversion of the next image sensors DUT by returning the first holder 321 to the initial state shown in FIG. 6A.

The system brings the four image sensors DUT supplied through the buffers 41, 42 simultaneously into contact with the four contacts 61 of the test head 60 by the contact arm 43, emits light to the light receiving surfaces RL of the image sensors 61 from the emission parts 81 of the light source 80, and, while doing so, inputs and outputs electrical signals through the contacts 61 and input/output terminals HB between the tester 20 and the image sensors DUT so as to test if the amounts of light received by the image sensors DUT are constant and other optical properties of the image sensors DUT (test step).

In this test, the tester 70 inputs electrical signals to the image sensors DUT in accordance with an input pattern of electrical signals corresponding to the device type of the image sensors DUT identified by the above-mentioned image processing system 90. Similarly, in this test, the light source 80 emits light to the light receiving surfaces RL of the image sensors DUT in accordance with an emission pattern corresponding to the identified device type of the image sensors DUT.

The image sensors DUT finished being tested by the test head 60 are moved by the first or second buffer 41, 42 and unloader use YZ movement device 51 to the unloader use inverting device 52.

Next, the unloader use inverting device 52 picks up the image sensors DUT by suction at the first holder 521, uses the rotation mechanism 522 to rotate the first holder 521 by 180°, places the sensors in the second holder 523, then releases the suction so as thereby to invert the tested image sensors DUT so that their light receiving surfaces RL face upward (second inversion step).

Next, the unloader use XYZ movements device 53 moves the inverted image sensors DUT to the sensor stacker 20, sorts them in the classification tray stackers 22 in accordance with the test results, and unloads the tested image sensors DUT. When sorting them in the classification tray stackers 22, in addition to the test results, the device type of the image sensor DUT identified by the above-mentioned image processing system 90 is also considered.

On the other hand, the loader use inverting device 52 finishing transferring the inverted image sensors DUT to the unloader use YZ movement device 53 rotates the rotation mechanism 522 by −180° to prepare for the inversion of the next image sensors DUT by returning the first holder 521 to its initial state (see FIG. GA).

As explained above, the image sensor test system according to the present embodiment inverts the image sensors DUT in the state with their light receiving surfaces RL facing upward by the loader use inverting device 32 so that their light receiving surfaces RL face downward, brings the inverted image sensors DUT into contact with the contacts 61 of the test head 60 by the contact arm 43 to test their optical properties, then inverts the tested image sensors DUT by the unloader use inverting device 52 to make their light receiving surfaces face upward for unloading.

Due to this, the image sensors can be tested in the state with their light receiving surfaces RL facing downward and the light receiving surfaces RL can be prevented from being covered by dust, so high accuracy tests can be performed.

Further, since the image sensors DUT can be tested in the state with their light receiving surfaces RL facing downward, it is possible to provide a light source 80 under the image sensors DUT separate from the handler 10, so the design freedom of the handler 10 and light source 80 is greatly improved and increases in the number of simultaneous measurements can be easily handled.

Further, since the handler 10 and the light source 80 are separated, space and wiring for the light source in the handler 10 become unnecessary and, compared with the case of the handler 10 itself being provided with a light source, the structures of both the handler 10 and the light source 80 can be simplified. Incidentally, in the above-mentioned embodiment, the case of the test head 60 being provided with tour contacts 61 and simultaneously measuring four devices was explained, but the present invention is not particularly limited in the number of simultaneous measurements. The number of simultaneous measurements can be set in accordance with need. In particular, in the present invention, the greater the number of simultaneous measurements, the more remarkable the above-mentioned effects distinctive to the present invention.

Note that the above explained embodiment was explained to facilitate understanding of the present invention and was not described to limit the present invention. Therefore, the elements disclosed in the above-mentioned embodiment include all design modifications and equivalents falling under the technical scope of the present invention.

Figure 10A:
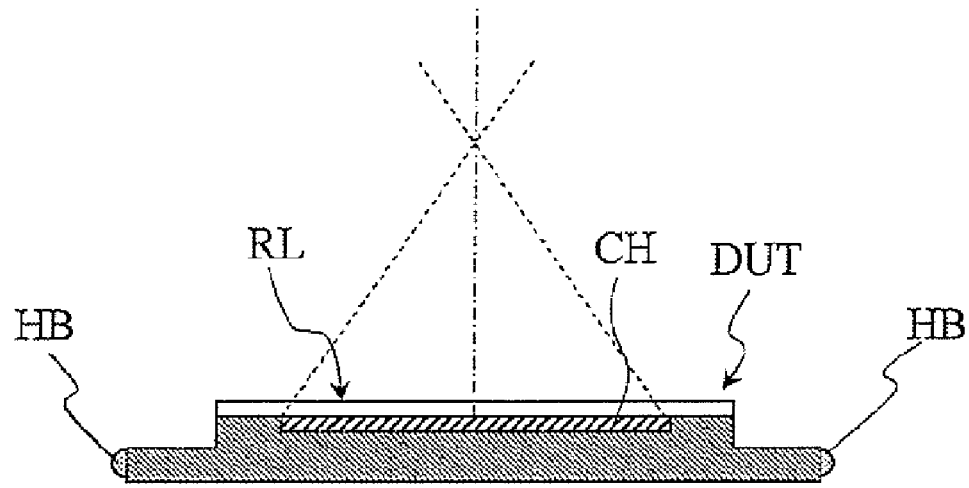
FIG. 10A is a sectional view of an image sensor of a type with input/output terminals led out from the sides with respect to the light receiving surface.
Figure 10B:
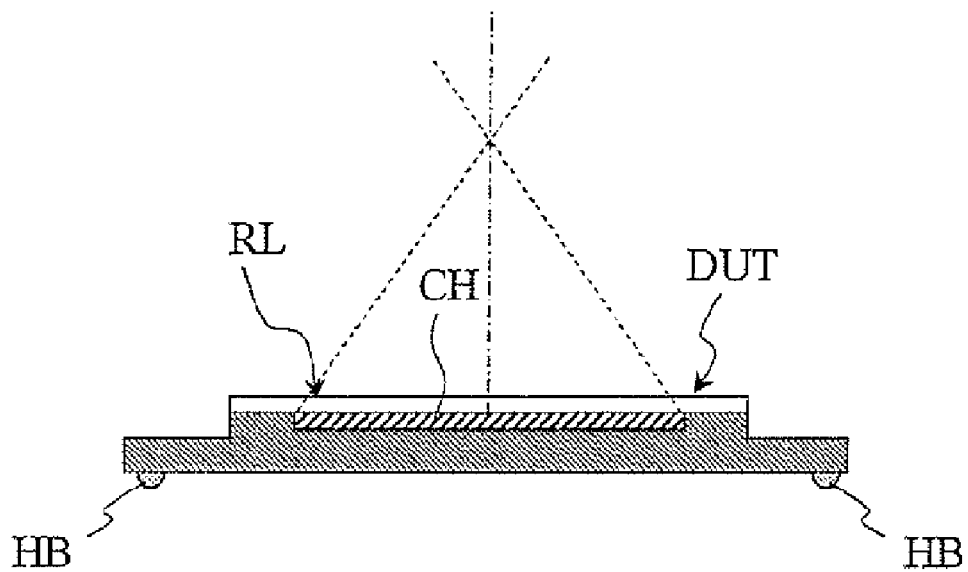
FIG. 10B is a sectional view of an image sensor of a type with input/output terminals led out from the opposite side from the light receiving surface.

For example, in the above-mentioned embodiment, the image sensor test system 10 was explained as testing image sensors DUT of the type with input/output terminals HB led out in the same directions as the light receiving surfaces RL, but the present invention is not particularly limited to this. For example, it may also test sensors of the type as shown in FIG. 10 with the input/output terminals HB led out from the sides or sensors of the type as shown in FIG. 10B with the input/output terminals HB led out from the opposite sides from the light receiving surfaces RL. Note that the sensors of the type shown in FIG. 10B structurally cannot be brought into direct contact with the contacts at the time of testing, so it is necessary to provide the contact arm with upper contacts around the suction pads and use these upper contacts to indirectly electrically connect the input/output terminals of the image sensors and the contact pins of the contacts.

Further, in the above-mentioned specific example, when desiring to store the tested inverted state image sensors in the inverted state in the classification tray stackers 22, it is possible to configure the system to additionally provide a conveyance path bypassing the unloader use inverting device 52. In this case, the advantage is obtained that the up-down orientation condition for storing the image sensors in the classification tray stackers 22 can be freely selected. Further, when the image sensors may be stored in the inverted state, it is possible to configure the system to omit the unloader use inverting device 52.

Further, in the above explained embodiment, the explanation was given using a specific example of image sensors as the devices under test, but a system may also be configured to provide the above-mentioned loader use inverting device 32 when it is necessary to invert electronic devices other than image sensors stored in a supply tray stacker 21 at the contacts 61. Further, it is also possible to configure a system to provide the above-mentioned unloader use inverting device 52 when desiring to invert the inverted state electronic devices to their original states. Further, in the case of the electronic devices, the light source 90 is unnecessary. According to this, even it the up-down orientation of the input/output terminals HB of the electronic devices carried on the supply tray stacker 21 differs from that of the contacts, testing is possible without problem. As a result, a test system able to handle various types of electronic devices can be realized.

The invention claimed is:

1. An image sensor test system configured to bring input/output terminals of an image sensor into contact with a contact of a test head, the image test system configured to emit light to a light receiving surface of the image sensor from a light source and, while doing so, inputting/outputting electrical signals between the contact of the test head and the image sensor so as to test the optical properties of the image sensor, the image sensor test system comprising:
   a pre-test sensor stacker configured to store image sensors before testing;
   a first inverter configured to invert an image sensor supplied from the pre-test sensor stacker;
   a contact arm configured to pick up and move the inverted image sensor inverted by the first inverter, the contact arm being configured to bring input/output terminals of the inverted image sensor into electrical contact with a contact of the test head;
   an attachment portion configured to attach the light source and the test head to the image sensor test system so as to place the light source and the test head beneath the image sensor;
   a second inverter configured to invert an image sensor after testing; and
   a plurality of post-test sensor stackers configured to store tested image sensors inverted by the second inverter.

2. The image sensor test system as set forth in claim 1, wherein each of the first and second inverters are configured to simultaneously invert at least two image sensors.

3. The image sensor test system as set forth in claim 1, wherein each of the first and second inverters comprises at least a first holder configured to hold an image sensor and a rotation mechanism configured to rotate the first holder.

4. The image sensor test system as set forth in claim 3, wherein the first holder comprises a suction nozzle configured to hold an image sensor by applying suction.

5. The image sensor test system as set forth in claim 4, wherein the first holder is exchangeable with another first holder having a suction nozzle different from the suction nozzle of the first holder, the another first holder corresponding to a size or shape of an image sensor.

6. An image sensor test system configured to bring input/output terminals of an image sensor into contact with a contact of a test head, the image test system configured to emit light to a light receiving surface of the image sensor from a light source and, while doing so, inputting/outputting electrical signals between the contact of the test head and the image sensor so as to test the optical properties of the image sensor, the image sensor test system comprising:
   a pre-test sensor stacker configured to store image sensors before testing;
   a first inverter configured to invert an image sensor supplied from the pre-test sensor stacker;
   a contact arm configured to pick up and move the inverted image sensor inverted by the first inverter, the contact arm being configured to bring input/output terminals of the inverted image sensor into electrical contact with a contact of the test head;
   a second inverter configured to invert an image sensor after testing; and
   a plurality of post-test sensor stackers configured to store tested image sensors inverted by the second inverter,
   wherein each of the first and second inverters comprises at least a first holder configured to hold an image sensor and a rotation mechanism configured to rotate the first holder, and
   wherein the rotation mechanism comprises a pinion gear which supports the first holder and a rack gear which intermeshes with the pinion gear and converts linear force supplied to the rack gear to rotational force so as to rotate the first holder.

7. An image sensor test system configured to bring input/output terminals of an image sensor into contact with a contact of a test head, the image test system configured to emit light to a light receiving surface of the image sensor from a light source and, while doing so, inputting/outputting electrical signals between the contact of the test head and the image sensor so as to test the optical properties of the image sensor, the image sensor test system comprising:
   a pre-test sensor stacker configured to store image sensors before testing;
   a first inverter configured to invert an image sensor supplied from the pre-test sensor stacker;
   a contact arm configured to pick up and move the inverted image sensor inverted by the first inverter, the contact arm being configured to bring input/output terminals of the inverted image sensor into electrical contact with a contact of the test head;
   a second inverter configured to invert an image sensor after testing; and
   a plurality of post-test sensor stackers configured to store tested image sensors inverted by the second inverter;
   an imaging device configured to obtain an image of a back surface of the image sensor after being inverted by the first inverter and before being supplied to the test head; and
   a judging device configured to judge an emission pattern of light emitted from the light source and an input pattern of electrical signals input from a contact of the test head based on image information obtained by the imaging device.

8. The image sensor test system as set forth in claim 7, further comprising a selector configured to select a tested sensor stacker to unload the image sensor from among the plurality of tested sensor stackers based on device type information obtained by the imaging device and classification information of the test results.

9. A test method for an image sensor which brings input/output terminals of an image sensor into contact with a contact of a test head, emits light to a light receiving surface of the image sensor from a light source, and, while doing so, inputs and outputs electrical signals between the contact of the test head and the image sensor so as to test the optical properties of the image sensor, the test method comprising:
   inverting an image sensor before testing,
   obtaining an image of an image sensor to obtain device type information before testing the inverted image sensor,
   judging an emission pattern of light emitted from the light source and an input pattern of electrical signals input from a contact of the test head based on the device type information obtained in obtaining the image of the image sensor, bringing the inverted image sensor into electrical contact with a contact of the test head and emitting light on a light receiving surface of the inverted image sensor from a light source to test the optical properties of the inverted image sensor, and inverting the tested inverted image sensor, in testing the inverted image sensor, emitting light to the light receiving surface of the image sensor in accordance with the emission pattern, and inputting and outputting electrical signals between the contact of the test head and the image sensor in accordance with the input pattern.

10. The test method for an image sensor as set forth in claim 9, further comprising sorting tested image sensors based on the device type information obtained in obtaining the image of the image sensor and classification information of the test results.

* * * * *